United States Patent [19]

Quinn

[11] Patent Number: 4,767,945

[45] Date of Patent: Aug. 30, 1988

[54] ANALOG SIGNAL MULTIPLEXER

[75] Inventor: Patrick A. Quinn, Aloha, Oreg.

[73] Assignee: Tektronix, Inc., Beaverton, Oreg.

[21] Appl. No.: 917,868

[22] Filed: Oct. 14, 1986

[51] Int. Cl.[4] .................... H03K 17/56; H03K 19/08; H03K 5/22

[52] U.S. Cl. .................................. 307/241; 307/494; 307/299.2

[58] Field of Search .................. 307/299 A, 494, 241, 307/254; 330/260, 261, 69

[56] References Cited

U.S. PATENT DOCUMENTS

| | | | |
|---|---|---|---|
| 3,851,187 | 11/1974 | Pao et al. | 307/299 A |
| 3,868,586 | 2/1974 | Korb | 307/299 A |
| 4,193,007 | 3/1980 | Tietz | 307/299 A |

Primary Examiner—Stanley D. Miller
Assistant Examiner—B. P. Davis

Attorney, Agent, or Firm—Mark L. Becker; Francis I. Gray

[57] ABSTRACT

An analog signal multiplexer for differential signals comprises a plurality of channels, each channel having a pair of differential amplifiers forming an input stage for receiving a differential input signal and a pair of output transistors for forming an output stage producing a differential output signal. Each differential amplifier has a pair of emitter-coupled transistors, with each transistor having an additional emitter cross-coupled to the additional emitter of the opposite transistor of the other emitter-coupled pair. A plurality of current sources are provided to bias the emitter-coupled and emitter cross-coupled pairs. By selectively enabling the current sources, the input signals forming the differential input signal can be applied with normal polarity or inverted polarity to a respective transistor of the output stage to produce a normal or inverted differential output signal or to both transistors of the output stage to produce no differential output signal.

8 Claims, 2 Drawing Sheets

ANALOG SIGNAL MULTIPLEXER

FIELD OF THE INVENTION

This invention relates to analog signal multiplexers and, more particularly, to such a multiplexer that passes an analog signal with its normal polarity or its inverted polarity or prevents passage of the signal entirely.

BACKGROUND OF THE INVENTION

Analog signal multiplexers switch input signals from one or more input paths to a single output path. These signals are often currents that can be summed or switched separately into the output path. For example, an analog signal multiplexer may receive three input currents and deliver any of these currents individually or summed together as an output signal.

The performance of an analog signal multiplexer is judged primarily on its precision, signal bandwidth, and switching speed. The precision, or linearity, is directly affected by changes in current as different input signals are switched to the output path and produce common mode voltage "bumps" or spikes in the switching process. The present invention overcomes this drawback by maintaining the linearity and signal bandwidth while switching between input paths.

SUMMARY OF THE INVENTION

An object of the invention therefore is to provide an improved analog signal multiplexer that minimizes bandwidth limitation, whose output signal is linearly proportional to its input signals and which provides switching speeds faster than presently available.

A second object of the invention is to provide for such a multiplexer a plurality of channels that are simple in design.

A third object of the invention is to provide such a channel that can also invert the polarity of its input signal in producing the output signal for the channel.

A fourth object of the invention is to provide such a channel that can turn off the signal path from the channel to the multiplexer.

To achieve these objects, an analog signal multiplexer according to the invention comprises a plurality of channels. Each channel includes a pair of differential amplifiers for receiving signals that form a differential signal and a pair of output transistors for applying negative feedback to each amplifier. Each output transistor produces an output signal that together form a differential output signal. The current gain of each output signal may be set by means such as a gain setting resistor in the emitter of each transistor. Each differential amplifier has a pair of emitter-coupled transistors with each transistor having a additional emitter cross-coupled to the additional emitter of the opposite transistor of the other emitter-coupled pair. To bias the emitter-coupled and the emitter cross-coupled pairs, a plurality of current sources are provided, each current source biasing a different pair.

Each channel of the analog signal multiplexer may operate in a number of different modes. In a NORMAL mode, current sources are enabled to bias the emitter-coupled pair of each differential amplifier to apply the two input signals comprising the differential input signal to the output transistors and produce a differential output signal of the same polarity as the differential input signal. In the INVERT mode, other current sources are enabled to bias the emitter cross-coupled transistor pairs to apply the input signals to opposite output transistors to produce a differential output signal with an inverted polarity. In an OFF mode each of the current sources is enabled to bias both the emitter-coupled transistor pairs and emitter cross-coupled pairs. With a substantially pure differential signal, both input signals of the differential input signal combine to produce no differential output signal.

The foregoing and other objects, features, and advantages of the invention will become more apparent from the following detailed description of a preferred embodiment which proceeds with reference to the accompanying drawings.

DETAILED DESCRIPTION

Figure 1:
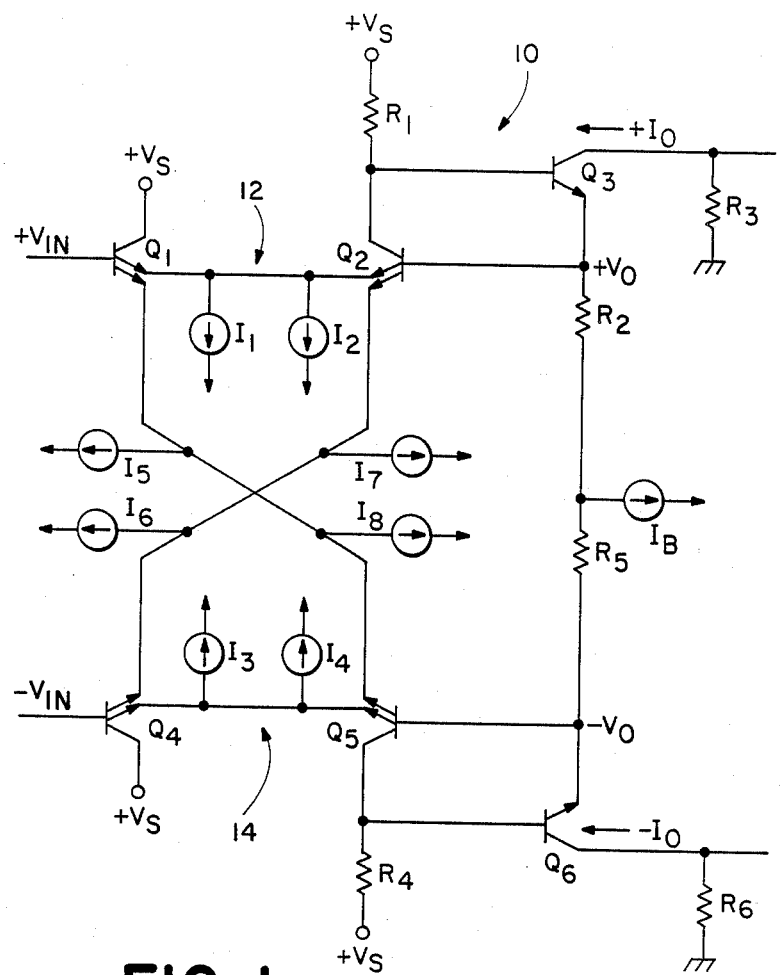
FIG. 1 is a schematic diagram of a channel of an analog signal multiplexer according to the invention.

FIG. 1 shows one channel of an analog signal multiplexer 10 embodying the invention. The circuit includes an input stage comprising a pair of differential amplifiers 12 and 14 for receiving a differential input signal comprising $+V_{in}$ and a $-V_{in}$. The differential amplifier 12 includes a pair of emitter-coupled transistors $Q_1$ and $Q_2$, $+V_{in}$ being received by the input stage at the base of $Q_1$. The differential amplifier 14 similarly includes a pair of emitter-coupled transistors $Q_4$ and $Q_5$, $-V_{in}$ being received at the base of $Q_4$. Each of these transistors $Q_1$ through $Q_4$ includes a second emitter for cross coupling the transistor to the opposite transistor of the other differential amplifier. $Q_1$, for example, is cross coupled to $Q_5$ to form a first emitter cross-coupled transistor pair. $Q_2$ is similarly cross-coupled to $Q_4$ to form a second emitter cross-coupled transistor pair.

$Q_1$ and $Q_2$ are biased as an emitter-coupled pair by a first selectable current source comprising $I_1$ and $I_2$. Although $I_1$ and $I_2$ are shown as independent current sources that can be selectively activated, they also represent a single current source that can be turned off or enabled to provide two levels of current, the first level being half of the second level.

$Q_4$ and $Q_5$ are similarly biased as an emitter-coupled pair by a second selectable current source comprising $I_3$ and $I_4$. $I_3$ and $I_4$ are independent current sources that also represent a single second current source that can be turned off or enabled to provide the two levels of current.

Each emitter cross-coupled transistor pair is provided with its own selectable current source for bias. The first emitter cross-coupled pair comprising $Q_1$ and $Q_5$ is biased by a third selectable current source represented by independent sources $I_5$ and $I_8$. The second emitter cross-coupled pair comprising $Q_2$ and $Q_4$ is biased by a fourth selectable current source represented by independent sources $I_6$ and $I_7$. These current sources, as those previously described, represent a single current source that can be turned off or enabled to provide two selectable levels of current.

The differential amplifier comprising $Q_1$ and $Q_2$ is coupled to an output transistor $Q_3$ that is biased by a current source $I_B$. The base of $Q_3$ is coupled to the collector of $Q_2$, and a resistor $R_1$ and voltage source that produce the collector current. The emitter of $Q_3$ is coupled to the base of $Q_2$ to provide negative feedback and produce a voltage $+V_o$ having unity voltage gain at the emitter of $Q_3$ with respect to the input signal affecting $Q_2$. The voltage $+V_o$ is applied across a gain-setting resistor $R_2$ whose resistance determines the current gain of $+I_o$ at the collector of $Q_3$. With the negative feedback, $+I_o$ is linearly proportional to the input signal applied to $Q_2$. Similarly, the differential amplifier comprising $Q_4$ and $Q_5$ is coupled to an output transistor $Q_6$ that is biased by current source $I_B$ through gain-setting resistor $R_5$. The base of $Q_6$ is coupled to the collector of $Q_5$ and a resistor $R_4$ and voltage source that produce the collector current. The emitter of $Q_6$ is coupled to the base of $Q_5$ to provide negative feedback and produce a voltage $-V_o$ having unity voltage gain with respect to the input signal affecting $Q_5$. The voltage $-V_o$ is applied across resistor $R_5$ to produce an output signal current $-I_o$ linearly proportional to the input signal applied to $Q_5$.

Each channel described above of the analog signal multiplexer 10 can operate in three modes: NORMAL, INVERTED, or OFF. The mode chosen determines the form of the differential output signal. As will be explained, the differential input signal in the NORMAL mode is passed from the bases at $Q_1$ and $Q_4$ to the collectors of $Q_3$ and $Q_6$ to produce an output signal current of the same polarity. In the INVERTED mode, the polarity of the output signal currents is inverted, with $+V_{in}$ appearing as a signal current at the collector of $Q_6$ and $-V_{in}$ appearing as a signal current at the collector of $Q_3$. In the OFF mode portions of both $+V_{in}$ and $-V_{in}$ are applied to both $Q_2$ and $Q_5$, blocking the passage of any input signal to $Q_3$ and $Q_6$ and producing no differential output signal for the stage.

Table 1 for selecting the mode of operation desired is shown below.

TABLE 1

| I | NORM | INV | OFF |
|---|------|-----|-----|
| 1 | . |   |   |
| 2 | . |   |   |
| 3 | . |   | . |
| 4 | . |   |   |
| 5 |   | . |   |
| 6 |   | . | . |
| 7 |   | . |   |
| 8 |   | . |   |

In the NORMAL mode of operation, the input signal voltage $+V_{in}$ and $-V_{in}$ are reproduced as $+V_o$ and $-V_o$ across resistors $R_2$ and $R_5$. The emitter-coupled transistor pairs are biased by enabling current sources $I_1$ through $I_4$ and disabling $I_5$ through $I_8$. Assuming transistors $Q_1$, $Q_2$ and $Q_4$, $Q_5$ are balanced, equal amounts of current are drawn into the collectors of each transistor with the voltage at each base equal. As $+V_{in}$ and $-V_{in}$ vary, the voltage at the emitters of $Q_1$ and $Q_4$ will vary, affecting the current drawn through the collector of the emitter coupled transistors $Q_2$ and $Q_5$. As $+V_{in}$ rises, for example, the voltage across the base emitter junction of $Q_2$ will decrease temporarily, decreasing the current drawn into the collector of $Q_2$ and causing the voltage at the base of $Q_3$ to rise. The voltage at the emitter of $Q_3$ rises as a result. With the emitter voltage fed back to the base of $Q_2$, the rising $Q_3$ base voltage causes $Q_2$ to draw more current through its collector and thereby lower its collector voltage. If $+V_{in}$ falls, on the other hand, the voltage across the base emitter junction of $Q_2$ increases temporarily, increasing the current drawn into the collector of $Q_2$ and thereby lowering the voltage at the base and emitter of $Q_3$. The same response occurs with $-V_{in}$ and transistors $Q_5$ and $Q_6$. Thus, the differential input voltage equal to $+V_{in}-(-V_{in})$ is replicated across $R_2$ and $R_5$. The current $+I_o$ is therefore proportional to $+V_{in}$ and $-I_o$ is proportional to $-V_{in}$.

In the INVERTED mode, the first emitter cross-coupled transistor pair $Q_5$ and $Q_1$ and the second cross-coupled pair $Q_4$ and $Q_2$ are biased by enabling current sources represented by $I_5$ through $I_8$ and disabling $I_1$ through $I_4$. The voltage $+V_{in}$ now affects transistor $Q_5$ and output transistor $Q_6$, and $-V_{in}$ affects transistor $Q_2$ and transistor $Q_3$. $Q_3$ and $Q_6$ respond as before, but the output signal currents $+I_o$ and $-I_o$ now have a polarity opposite of that $+V_{in}$ and $-V_{in}$, respectively.

In the OFF mode, both the emitter-coupled pairs and the emitter cross-coupled pairs are biased by selecting the odd numbered current sources and disabling the even numbered sources, or vice versa. This cross biasing applies $+V_{in}$ and $-V_{in}$ to both $Q_2$ and $Q_5$.

The effect of applying $+V_{in}$ to the coupled pairs of $Q_1$, $Q_2$, and $Q_1$, $Q_5$ and applying $-V_{in}$ to the coupled pairs of $Q_4$, $Q_2$ and $Q_4$, $Q_5$ is best understood by example. Assume that no input signal is applied to the bases of $Q_1$ and $Q_5$ and that the bias voltage is zero volts. The emitter of $Q_1$ will be changed to $-0.7$ volts. The base of $Q_2$ will attempt to respond to the negative feedback of $Q_3$ to change to zero volts. However, $+V_o$, the $Q_2$ base voltage, is also under the influence of $-V_{in}$ through the coupling of the additional emitter of $Q_2$ to $Q_4$. In this case, the additional emitter is also at $-0.7$ volts; so no voltage difference across the parallel emitters arises and $Q_2$ base voltage changes to zero volts. The same result occurs at the base of $Q_5$ and $-V_o$ changes to zero volts.

Now assume a small differential voltage is applied to the bases of $Q_1$ and $Q_4$, $+0.1$ volts at $Q_1$ and $-0.1$ volts at $Q_4$. The currents in the transistors will vary in response to the differing base voltages. Most of $I_1$ flows through $Q_1$ because $+V_{in}$ is more positive than $+V_o$. Most of $I_7$ flows through $Q_2$ because $-V_{in}$ is less positive than $+V_o$. Most of $I_3$ flows through $Q_5$ because $-V_{in}$ is less positive than $-V_o$. Most of $I_5$ flows through $Q_1$ because $+V_{in}$ is more positive than $-V_o$. As a result, one unit of current flows in $Q_2$, and one unit in $Q_5$; nearly two units of current flow in $Q_1$; very little current flows in $Q_4$. The current through the collectors of $Q_2$ and $Q_5$ remain constant as $+V_{in}$ and $-V_{in}$ vary.

If the input signal voltage is varied by a greater amount, for example, $+V_{in}$ up to 1 volt and $-V_{in}$ up to $-1$ volt, $+V_o$ and $-V_o$ continue to remain at zero volts. A $+V_n$ of 1 volt raises the emitter voltage of $Q_2$ to 0.3 volts approximately. A $-V_{in}$ of $-1$ volt would cause the additional emitter's voltage to fall to $-1.7$ volts, but this fall is prevented by the limitation on $+V_o$ to zero volts. This voltage limits the emitter voltage of $Q_4$ and $Q_2$ to $-0.7$ volts, turning off the emitter of $Q_4$ coupled to $Q_2$ and the emitter of $Q_2$ coupled to $Q_1$. Similarly, $-V_o$ will not drop below zero volts, thereby shutting off the emitter of $Q_5$ coupled to $Q_1$ and the emitter of $Q_4$ coupled to $Q_5$. The other emitters of $Q_5$ and $Q_2$ remain active. Therefore, the collector currents through $Q_2$ and $Q_5$ remain constant when $+V_{in}$ and $-V_{in}$ are applied to both $Q_2$ and $Q_5$.

Figure 2:
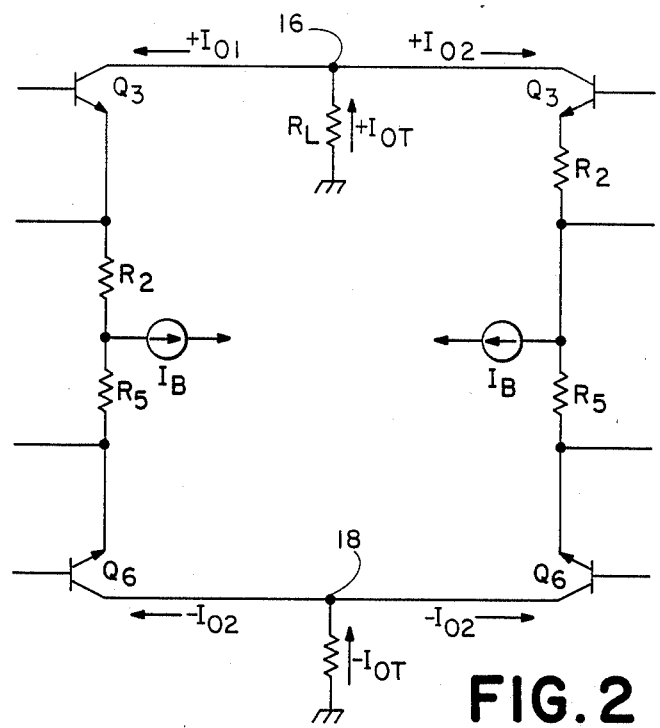
FIG. 2 is partial schematic diagram of an analog signal multiplexer showing the connection of two channels.

FIG. 2 shows a schematic section of two multiplexer channels together. The output currents $+I_{o1}$ and $+I_{o2}$ are summed at an output node 16 of the multiplexer. With both channels in the NORMAL mode, $I_{oT}$ is the sum of the two currents. With either channel in the INVERTED mode, $I_{oT}$ is the difference between the two currents. With either channel in the OFF mode, $I_{oT}$ will equal only the current of the enabled channel. Similarly, $-I_{oT}$ is the sum of $-I_{o1}$ and $-I_{o2}$ at an output node 18.

Figure 3:
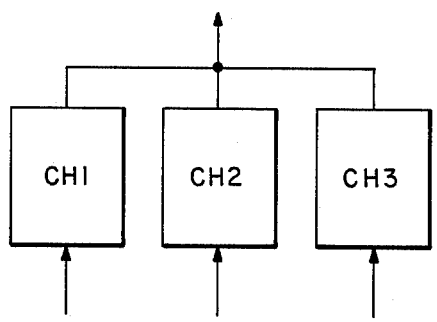
FIG. 3 is a block diagram of an analog signal multiplexer comprising a plurality of channels.

FIG. 3 shows a block diagram of a three channel analog signal multiplexer illustrating how a number of input signals can be multiplexed together. Each channel has a separate input signal path with the outputs of the channels combined in a common output signal path.

The advantage of the analog signal multiplexer 10 over the prior art is evident from the continuous flow of current that results when a channel is switched to the OFF mode. Unlike prior art multiplexers, no common mode voltage "bumps" or spikes occur when a channel is switched to the OFF mode or between other modes because the currents in $Q_2$ and $Q_5$ remain constant when $+V_{in}$ and $-V_{in}$ are applied to both transistors. The speed of the switching can be therefore higher because the differential amplifiers experience little adverse effect as the result of the rapid switching between modes.

Having illustrated and described the principles of the invention in a preferred embodiment, it should be apparent to those skilled in the art that the invention can be modified in arrangement and detail without departing from such principles. For example, $Q_1$ through $Q_8$ are represented by single bipolar transistors. Alternative devices may also be used, such as Darlington pairs, field effect transistors, or combinations thereof.

I claim all modifications coming within the spirit and scope of the following claims:

1. An analog signal multiplexer channel comprising:
    first and second differential amplifiers for receiving a differential input signal, each differential amplifier having a pair of transistors, each transistor having first and second emitters, the first emitters of the transistors within each differential amplifier being coupled together, the second emitters of the transistors of said first differential amplifier being cross coupled to the second emitters of the transistors of said second differential amplifier, thereby forming a pair of cross coupled second emitters;
    means for selecting one of a plurality of modes of operation of the analog signal multiplexer channel having:
        a first selectable current source for biasing the first emitters of the transistors of said first differential amplifier,
        a second selectable current source for biasing the first emitters of the transistors of said second differential amplifier,
        a third selectable current source for biasing one of the pair of cross coupled second emitters, and
        a fourth selectable current source for biasing the other of the pair of cross coupled second emitters; and
    a pair of output transistors for producing a differential output signal responsive to said input signal, each output transistor respectively coupled to said first and second differential amplifiers.

2. The multiplexer channel of claim 1 in which each of the current sources can be selectably turned off and turned on to provide at least two levels of current.

3. The multiplexer channel of claim 2 in which each current source comprises a pair of independent current sources that can be selectably turned off and on.

4. The multiplexer channel of claim 1 in which the first and second current sources are selected to bias the first emitters of the transistors of said first and second differential amplifiers to apply the differential input signal with its normal polarity to the output transistors to produce the differential output signal as one of the modes of operation.

5. The multiplexer channel of claim 1 in which the third and fourth current sources are respectively selected to bias each of the pair of cross coupled second emitters of the transistors of said first and second differential amplifiers to apply the differential input signal with inverted polarity to the output transistors as the differential output signal as one of the modes of operation.

6. The multiplexer channel of claim 2 in which each of the current sources is selected to bias the first and second emitters of the transistors of said first and second differential amplifiers to produce no output signal as one of the modes of operation.

7. An analog signal multiplexer according to claim 1 comprising a plurality of multiplexer channels, the multiplexer having separate input signal paths and a common output signal path.

8. An analog signal multiplexer comprising a plurality of channels, each channel comprising:
    first and second differential amplifiers each having a pair of transistors, each transistor having first and second emitters, the first emitters of the transistors within each differential amplifier being coupled together, the second emitters of the transistors of said first differential amplifier being cross coupled to the second emitters of the transistors of said second differential amplifier, thereby forming a pair of cross coupled second emitters, said differential amplifiers forming an input stage for receiving a differential input signal on an input signal path;
    an output stage having a pair of outputs, the output stage coupled to the input stage to produce a differential output signal;
    a plurality of current sources for biasing each differential amplifier;
    means for selecting one of a plurality of modes of operation for each multiplexer channel by having the current sources in a plurality of arrangements to apply the input signal to the output stage with normal polarity to produce a normal output signal mode, with inverted polarity to produce an inverted output signal mode, and apply both portions to both outputs of the output stage to produce a no output signal mode; and
    means for combining the output signals of each channel in a common output signal path.

* * * * *